US009596777B2

(12) United States Patent
Weber

(10) Patent No.: US 9,596,777 B2
(45) Date of Patent: Mar. 14, 2017

(54) ENCLOSURE FOR ELECTRICAL INSTALLATIONS

(71) Applicant: FIBOX OY AB, Espoo (FI)

(72) Inventor: Kenneth Weber, Karjaa (FI)

(73) Assignee: FIBOX OY AB, Espoo (FI)

( * ) Notice: Subject to any disclaimer, the term of this patent is extended or adjusted under 35 U.S.C. 154(b) by 0 days.

(21) Appl. No.: 14/901,212

(22) PCT Filed: Jun. 27, 2014

(86) PCT No.: PCT/FI2014/050535
§ 371 (c)(1),
(2) Date: Dec. 28, 2015

(87) PCT Pub. No.: WO2014/207320
PCT Pub. Date: Dec. 31, 2014

(65) Prior Publication Data
US 2016/0143171 A1    May 19, 2016

(30) Foreign Application Priority Data

Jun. 27, 2013    (FI) ...................................... 20135706

(51) Int. Cl.
| | |
|---|---|
| H05K 5/03 | (2006.01) |
| H02B 1/38 | (2006.01) |
| H05K 5/02 | (2006.01) |

(52) U.S. Cl.
CPC ................ *H05K 5/03* (2013.01); *H02B 1/38* (2013.01); *H05K 5/0221* (2013.01)

(58) Field of Classification Search
USPC .................................................. 174/50, 520
See application file for complete search history.

(56) References Cited

U.S. PATENT DOCUMENTS

| | | | |
|---|---|---|---|
| 4,345,697 A * | 8/1982 | Wilson | H02B 1/066 |
| | | | 16/260 |
| 5,147,981 A | 9/1992 | Buet et al. | |
| (Continued) | | | |

FOREIGN PATENT DOCUMENTS

| | | |
|---|---|---|
| CN | 201819936 U | 5/2011 |
| KR | 20-0442481 Y1 | 11/2008 |
| KR | 10-2010-0111933 A | 10/2010 |

*Primary Examiner* — Dhirubhai R Patel
(74) *Attorney, Agent, or Firm* — Birch, Stewart, Kolasch & Birch, LLP

(57) ABSTRACT

An enclosure for electrical installations includes a rectangular bottom part and a hinged door to be fastened to the bottom part. The bottom part includes sidewalls extending upward, the door being turnable from a closed position, in which it covers the door opening of the enclosure, to an open position, in which it leaves the door opening open. In order for the door to be easily and quickly fastened to the bottom part, the door is fastened to the bottom part by a detachable door frame, which door frame includes at least two quick-release mechanisms to fasten it detachably to at least two detents in the bottom part so that the door frame is locked at the detents and the bottom part when the quick-release mechanisms are in the locked position, and the door frame may be released from the bottom part when the quick-release mechanisms have been opened and released from the detents. The enclosure includes a cover which covers the door frame and the door, which cover is fastened to the bottom part.

8 Claims, 2 Drawing Sheets

(56) References Cited

U.S. PATENT DOCUMENTS

| | | |
|---|---|---|
| 5,378,058 A | 1/1995 | Tessmer |
| 5,547,095 A | 8/1996 | Sonntag et al. |
| 7,205,488 B2 * | 4/2007 | Riner .................... H02G 3/185 |
| | | 174/481 |
| 2011/0298347 A1 | 12/2011 | Birkenstock et al. |
| 2013/0113347 A1 | 5/2013 | Mao et al. |

* cited by examiner

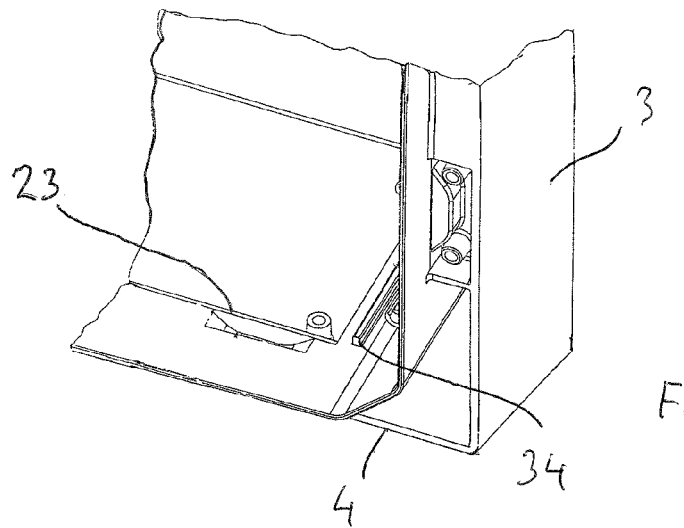
Fig. 4
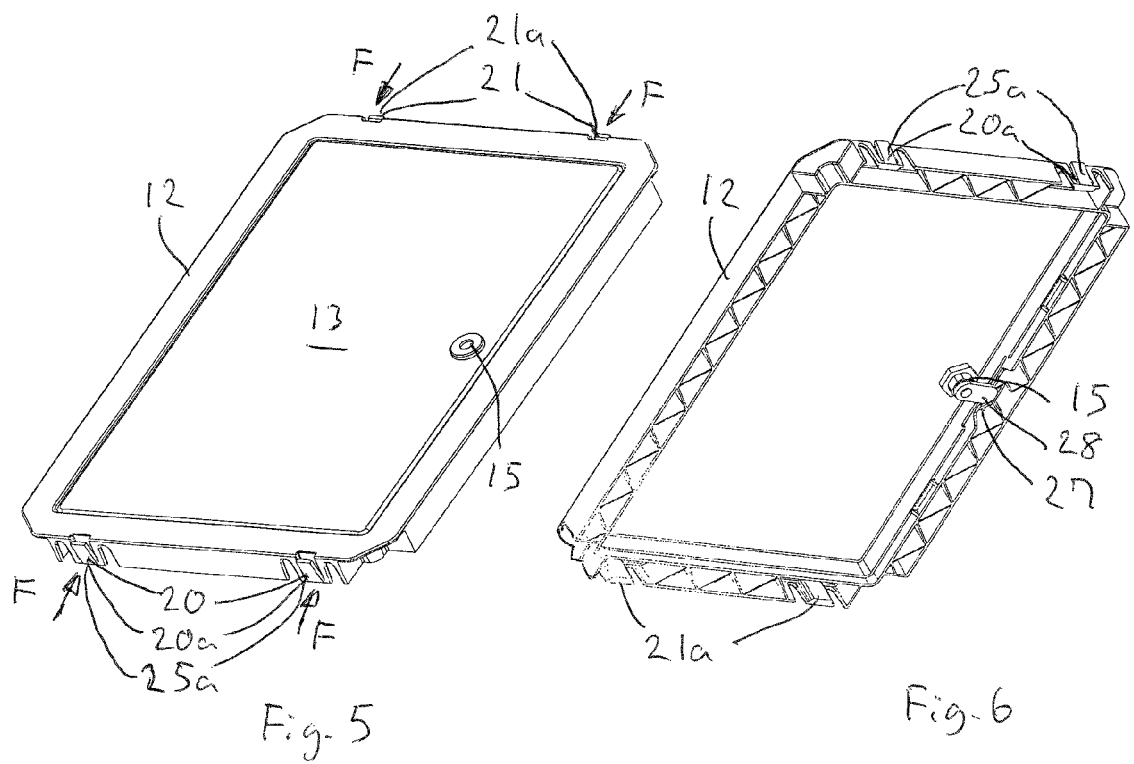
Fig. 5
Fig. 6

ENCLOSURE FOR ELECTRICAL INSTALLATIONS

BACKGROUND OF THE INVENTION

The invention relates to an enclosure for electrical installations, the enclosure comprising a rectangular bottom part and a hinged door to be fastened at a door opening of the bottom part, the bottom part comprising a bottom and sidewalls extending upward from the bottom, the door being turnable from a closed position, in which it covers the door opening, to an open position, in which is leaves the door opening open.

Enclosures of the type referred to are quite common. The problem with such enclosures is that fastening the door to the bottom part is difficult and time-consuming. Further, fastening requires the use of tools and fastening means, such as screws that are easily misplaced. Problems associated with installation are highlighted in case a door needs to be installed in the bottom part only at site of use of the enclosure. It is possible that difficult conditions prevail at the site of use, and installation may have to be performed in sub-zero temperatures.

BRIEF DESCRIPTION OF THE INVENTION

The object of the invention is to create an enclosure for electrical installations, the door of such an enclosure being most simple to fasten to the bottom part of the enclosure also at the site of use of the enclosure. There is no need to use tools when installing the door.

The object of the invention is achieved by an enclosure for electrical installations, comprising a rectangular bottom part and a hinged door to be fastened at a door opening of the bottom part, which bottom part comprises a bottom and sidewalls extending upward from the bottom, the door being turnable from a closed position in which in covers the door opening to an open position in which it leaves the door opening open, the door being fastened to the bottom part by means of a door frame detachable from the bottom part, and the enclosure comprising a cover which covers the door frame and the door, which cover is fastened to the bottom part, wherein

- the door frame comprises at least two quick-release means to fasten it detachably to at least two detents in the bottom part so that the door frame is locked at the detents and the bottom part when the quick-release means are in the locked position, and the door frame may be released from the bottom part when the quick-release means have been opened and released from the detents,
- two opposite edges of the door frame comprise said quick-release means, whereby the inner surfaces of two opposite sidewalls of the bottom part, facing the interior of the enclosure, comprise said detents,
- the quick-release means comprise a locking tongue, devised as flexible, and the detent is on the inner surface of the bottom part interior, on the inner surface of the sidewall of the bottom part,
- the locking tongue is arranged to receive a first force and to strain and flex when the door frame is being installed to the bottom part by moving it towards the bottom of the bottom part, and once the door frame is installed on the bottom part, the locking tongue is at the detent and unstrained or a second force is directed on the locking tongue, which is smaller than the first force, and, correspondingly, the straining and flexing of the locking tongue is smaller than the flexing and straining thereof when the door frame is being moved towards the bottom of the bottom part, and
- the door frame covers the door opening so that access to the locking tongue, in order to open the locking position of the locking tongue, requires the door to be opened, whereby as the door is open, a first surface of the locking tongue may be accessed in order to apply external force on its first surface so that the locking tongue flexes and the locking tongue is released from the detent in the bottom part, whereby the door frame may be lifted off the bottom part.

The essential idea behind the invention is to utilise a door frame, to be fastened to the bottom part, for fastening the door, which door frame can be positioned in place in the bottom part by quick-release means.

Advantageously, two opposite edges of the door frame comprise said quick-release means, whereby the inner surfaces of the two opposite sidewalls of the bottom part, facing the interior of the enclosure, comprise said detents. The detents formed on the inner surfaces allow the outer surfaces of the enclosure sidewalls to be smooth and smart.

Advantageously, a quick-release means at the edge of the door frame comprises a locking tongue, devised as flexible, whereby the detent is on the inner surface of the bottom part interior, on the inner surface of the sidewall of the bottom part. Such a locking tongue is easy to lock in a recess by simply pushing the door frame towards the door frame, whereby the locking tongue will snap into place in the recess.

The enclosure door is advantageously sealed. Due to sealing, access by moisture into the interior of the enclosure is prevented.

Preferred embodiments of the enclosure according to the invention are disclosed in the attached dependent claims.

The biggest advantage of the enclosure according to the invention is that its door may easily and quickly be fastened to the bottom part and, when desired, detached from the bottom part. Thanks to the cover, the door as well as the enclosure interior are protected against outdoor air.

BRIEF DESCRIPTION OF THE DRAWINGS

The invention will now be described in more detail by means of a preferred embodiment thereof and with reference to the accompanying drawing, in which FIG. 4 shows a detail of the bottom part of FIG. 2, and FIGS. 5 and 6 show the door frame-door combination of FIG. 3 as a perspective as seen obliquely from above (the front) and obliquely from below (the back).

DETAILED DESCRIPTION OF THE INVENTION

Figure 1:
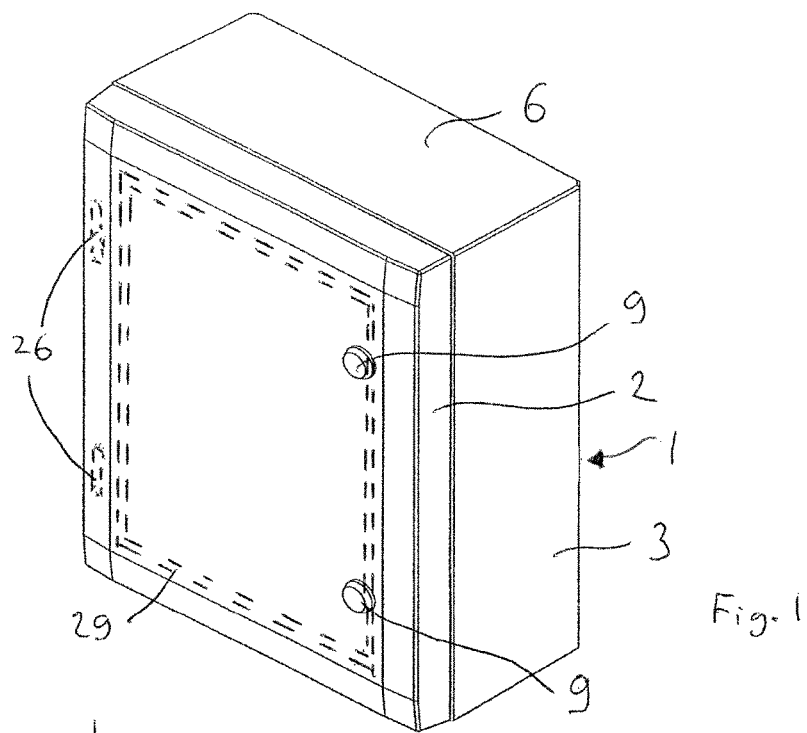
FIG. 1 shows a general view of an enclosure according to the invention.

The enclosure for electrical installations shown in FIG. 1 comprises a bottom part 1 and a cover 2 fastened to the bottom part. The bottom part 1 comprises four sidewalls extending upward from the bottom (see, bottom 10 of FIG. 2). FIG. 1 shows the sidewalls 3 and 6 of the bottom part 1, and FIG. 2 additionally shows sidewalls 4 and 5 of the bottom part 1. The cover 2 is hinged to the bottom part 1, to fasteners 8a at the upper edge of the left wall 5 (upper edge 7 in FIG. 2). Hinges 26, by which the cover 2 is hinged to the bottom part 1, are illustrated by a dotted line in FIG. 1. The cover 2 comprises locking means 9 that make it possible to lock the cover to the bottom part 1 of the enclosure. The cover 2 may be turned from a closed position of FIG. 1, where it covers the bottom part 1, to an open position whereby the door frame 12 with the door 13, positioned under the cover, will show. FIG. 3 shows the door frame-door combination of the enclosure, comprising the door frame 12 and the door 13 hinged to it. The hinging and the positioning thereof of the door 13 is illustrated with reference number 14. Reference number 15 points to a closure device, by means of which the door may be locked to the frame 12.

As illustrated by FIG. 3, there are two quick-release means 20 and 21 on both opposite edges 17 and 19 of the door frame 12. The purpose of the quick-release means 20, 21 is to lock the door frame 12 to the bottom part 1 detachably. When the quick-release means 20, 21 are in the locked position, the door frame 12 is locked to the bottom part 1. The quick-release means 20, 21 comprise a locking tongue 20a, devised as flexible, and correspondingly 21a. The sidewall 4 of the bottom part 1 has detents 23 to receive the locking tongues 20a, and the sidewall 6 of the bottom part has detents 24 to receive the locking tongues 21a. The detents 23, 24 are collars that have been formed on the inner surfaces of the opposite sidewalls 4 and 6 of the bottom part 1, see FIG. 4. There are two detents 23 on the sidewall 4, see FIG. 2. There are corresponding detents 24 on the sidewall 6 of the bottom part 1, cf. FIG. 2. The detents 23, 24 may have been established by forming a step on the inner surface of the sidewalls 4, 6, which may be essentially of the length of the sidewall. Alternatively, there could be a number of shorter steps.

The locking tongues 20a, 21a can better be seen in FIG. 5 than in FIG. 3. The locking tongues 20a, 21a are flexible, whereby they are arranged to flex when an external force, cf. force F, is directed on their first surface 25a, 25b. The door frame 12 is so dimensioned that it is of the size of the door opening 11. The locking tongues 20a, 21a are aimed slightly out of the outer rim of the door frame 12 (cf. FIG. 3) so that the first surface of the locking tongues 20, 21a, cf. surface 25a on locking tongue 20a and surface 25b (in FIG. 3) on locking tongues 21a, hits the inner walls 4 and 6 of the bottom part 1 as the door frame 12 is being installed in place on top of the bottom part 1. When the door frame 12 is moved downward, towards the bottom 10, the inner surface of the interior presses the locking tongues 20a, 21a whereby an external force F is directed on the locking tongues 20a, 21a, this force making the locking tongues strain and flex. The door frame 12 is easy to move by hand: it is simply pushed towards the bottom 10 of the bottom part. When the door frame 12 has been moved enough towards the bottom 10, the locking tongues 20a, 21a are aligned with the detents 23, 24 (under the collars) and, in a way, snap into place and form a quick-release for the door frame, whereby the external force directed on them ceases. When the locking tongues 20a, 21a are at the detents 23, 24, they are in the locked position and the locking tongues 20a, 21a are unstrained. It is, however, conceivable that a force might alternatively be directed on the locking tongues, when they are in the locked position at the detents, which is smaller than the force that is directed on them when the frame 12 is moved towards the bottom 10.

In accordance with the above, the locking tongues 20a, 21a are arranged to receive the external first force F and to strain and flex when the door frame 12 is being installed to the bottom part by moving it towards the bottom 10 of the bottom part, whereby once the door frame is installed to the bottom part, the locking tongues are at the detents 23, 24 (under the collars) and unstrained. Alternatively, a second force may be directed on the locking tongues 20a, 21a when they are at the detents 23, 24, which is smaller than the first force and, correspondingly, the straining and flexing of the locking tongue is lesser than the flexing and straining at the time the door frame is being moved towards the bottom of the bottom part.

When the door frame 12 has been installed on top of the bottom part 1, it is supported from below on supports 34-37 in corners 30-33 of the bottom part 1, see FIGS. 3 and 4 that show the top end of the support 34, providing a point of support for the lower edge of the door frame 12. Each corner 30-33 of the bottom part 1 has a support 34-37 to support the door frame 12 at the desired height.

Figure 2:
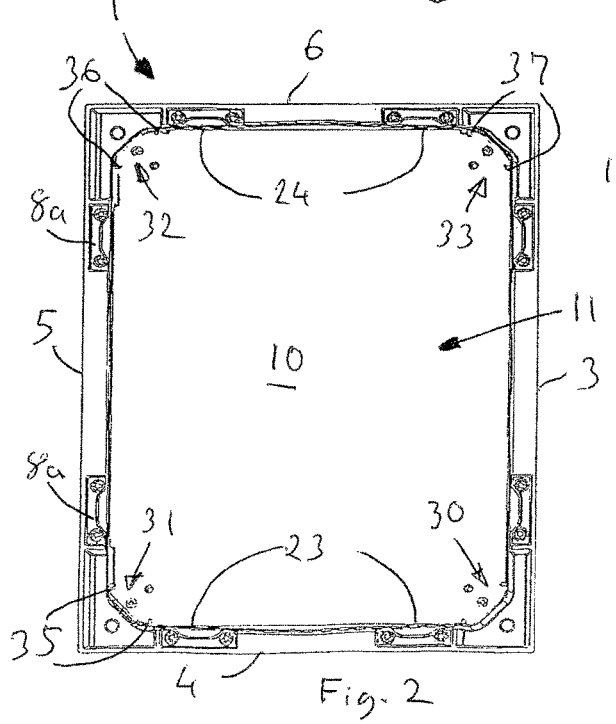
FIG. 2 shows the bottom part of the enclosure of FIG. 1 as seen directly from above.
Figure 3:
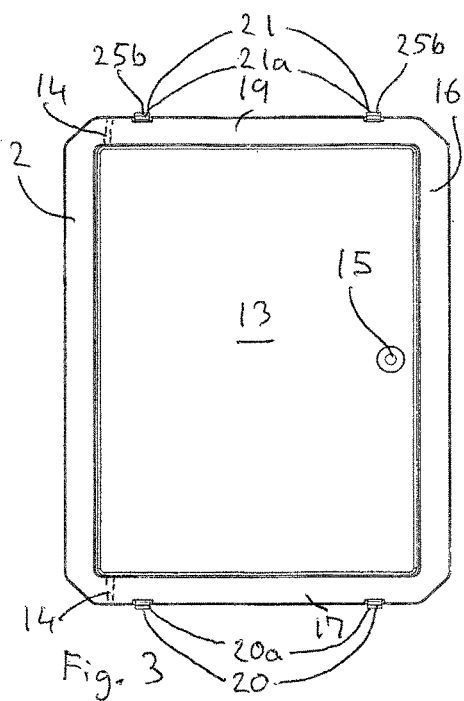
FIG. 3 shows the door frame-door combination of the enclosure.

When the door frame 12 has been installed on top of the bottom part 1 and the door 13 is closed, there is such a small gap between the door frame and the internal surfaces of the sidewalls 3-6 of the bottom part that there will be no access to the locking tongues 20a, 21a in order to bend them, with the aim to open the quick-release formed by them, cf. FIGS. 2 and 3 for better understanding of this. Correspondingly, there is such a small gap between the outer rim of the door 13 and the inner rim of the door frame 12 that there will be no access to the locking tongues 20a, 21a in order to bend them, with the aim to open the quick-release formed by them, cf. FIG. 3.

The door 13 comprises a closure device 15 to fasten the door against a stopper 27 on the door frame 12, see FIG. 6. The closure device 15 is advantageously a lock that can be locked with a key, and the clamping element 28 is advantageously a latch. The stopper 27 is formed from the lower edge of the door frame 12. Alternatively, it is conceivable that the clamping element 28 is locked against a stopper (now shown) in the bottom part 1.

Access to the interior 11 of the enclosure is only possible by opening the door 13. If the door frame 12 is desired to be removed from the bottom part 1, the door 13 must first be opened. After this, a chisel type of tool, such as a screwdriver (not shown) may be used to squeeze the first surface 25 of the locking tongues 20a, 21a by applying external force so that the locking tongues flex enough so that their locking edge (the tip of the locking tongue) is released from the detents 23, 24. When the locking edge of the locking tongue 20a, 21a is released from the detent 23, 24, also the locking tongue is released from the detent. When the locking tongues 20a, 21a are in the released position, the door frame 12 may be released from the bottom part 1 and lifted out of (up) the bottom part.

It is recommended that the door frame 12 be made of plastic, whereby it is possible to form said locking tongues 20a, 21a on it as one piece with the door frame. Alternatively, the door frame 12 may be metallic.

The cover 2 of the enclosure covers the door frame 12, cf. FIG. 1. When there is additionally a seal between the cover 2 and the bottom part 1, cf. the seal 29 indicated by a dotted line and surrounding the frame 12 in FIG. 1, an enclosure is achieved that comprises a lockable door 13, and the interior 11 of which is additionally protected against humidity.

In the above, the invention is only described by means of one of its preferred embodiments, wherefore it is noted that the details of the invention may be implemented in various ways within the scope of the attached claims. Consequently, the design, position, and quantity of the quick-release means, for example, may differ from what was put forth, as can the design, position, and quantity of the recesses. It is conceivable that the detents in which the locking tongues are locked are formed of the wall and/or edge of recesses formed in the sidewalls of the bottom part.

The invention claimed is:

1. An electrical enclosure assembly comprising:
a housing comprising a rectangular bottom wall, a plurality of side walls extending from the bottom wall, and an interior opening;
a cover;
a door;
a door frame attached to the housing; and
a plurality of detents,
wherein the door is hinged to the door frame, said interior opening can be closed when the door is in a closed position and open when the door is in an open position, said cover is hinged to one of the sidewalls of the housing and covers the door frame and the door when the cover is in a closed position, and said detents are mounted on an inner surface of the bottom wall, wherein the door frame comprises four side edges, a plurality of flexible locking tongues mounted to two opposing of the four side edges, respectively, the door frame can be locked to one of the plurality of side walls of the housing when the locking tongues are received in the detents and the door frame is in the locked position, and the door frame can be released from the housing when the locking tongues have been opened and released from the detents, wherein each of the locking tongues is arranged to receive a first manual force and to strain and flex when the door frame is being installed to the housing by moving the locking tongue towards a bottom of the housing, and once the door frame is installed on the housing, the locking tongues are at the detents and unstrained or a second manual force is directed on the locking tongues, which is smaller than the first manual force, and, correspondingly, the straining and flexing of the locking tongues are smaller than the flexing and straining thereof when the door frame is being moved towards the bottom of the housing, and
wherein the door frame covers the interior opening so that access to the locking tongues, in order to open the locking position of the locking tongues, requires the door to be opened, whereby as the door is opened, a first surface of each of the locking tongues may be accessed in order to apply a manual external force on the first surface so that the locking tongues flex and the locking tongues are released from the detents in the housing, whereby the door frame may be lifted off the housing.

2. The electrical enclosure assembly as claimed in claim 1, wherein the door further comprises a closure device, the closure device comprising a closure element to fasten the door against a stopper in the door frame, the stopper being at the door frame edge opposite to the hinging of the door.

3. The electrical enclosure assembly as claimed in claim 2, wherein the two opposing of the four side edges of the door frame each have two of said locking tongues with cooperating of said detents, said two detents being provided on each of internal surfaces of the two opposing of the sidewalls of the housing.

4. The electrical enclosure assembly as claimed in claim 1, wherein the two opposing of the four side edges of the door frame each have two of said locking tongues with two cooperating of said detents, said two detents being provided on internal surfaces of two opposing of the sidewalls of the housing.

5. The electrical enclosure assembly as claimed in claim 1, wherein the locking tongues on the door frame are formed as a single piece with the door frame.

6. The electrical enclosure assembly as claimed in claim 1, wherein the hinge is fastened to an upper edge of one of the plurality of sidewalls of the housing, said one of the plurality of sidewalls joining two other of the plurality of sidewalls of the housing.

7. The electrical enclosure assembly as claimed in claim 1, wherein there is a seal between the cover and the bottom wall, surrounding the door frame, to seal the door frame and the door against outdoor air.

8. The electrical enclosure assembly as claimed in claim 1, wherein four corners of the door frame are arranged to be supported by supports in corners of the housing, a point of support being at a distance from the bottom of the bottom wall in a height direction of the housing to determine a height position of the door frame in the housing.

* * * * *